(12) United States Patent
Kawaguchi et al.

(10) Patent No.: US 10,440,869 B2
(45) Date of Patent: Oct. 8, 2019

(54) COMPONENT MOUNTING HEAD AND SUCTION NOZZLE ASSEMBLY TO BE USED THEREIN

(71) Applicant: FUJI CORPORATION, Chiryu (JP)

(72) Inventors: Koji Kawaguchi, Kasugai (JP); Junichi Narita, Anjo (JP)

(73) Assignee: FUJI CORPORATION, Chiryu (JP)

( * ) Notice: Subject to any disclaimer, the term of this patent is extended or adjusted under 35 U.S.C. 154(b) by 0 days.

(21) Appl. No.: 15/576,749

(22) PCT Filed: May 27, 2015

(86) PCT No.: PCT/JP2015/065199
§ 371 (c)(1),
(2) Date: Nov. 24, 2017

(87) PCT Pub. No.: WO2016/189678
PCT Pub. Date: Dec. 1, 2016

(65) Prior Publication Data
US 2019/0014698 A1    Jan. 10, 2019

(51) Int. Cl.
*H05K 13/04*    (2006.01)
*H05K 13/08*    (2006.01)

(52) U.S. Cl.
CPC ..... *H05K 13/0409* (2018.08); *H05K 13/0413* (2013.01); *H05K 13/082* (2018.08)

(58) Field of Classification Search
CPC .................................................. G05K 13/0109
(Continued)

(56) References Cited

U.S. PATENT DOCUMENTS 6,240,628 B1 * 6/2001 Yoshida ............. H05K 13/0413
29/740
6,328,362 B1   12/2001 Isogai et al.
(Continued)

FOREIGN PATENT DOCUMENTS

EP    1 075 174 A1   2/2001
JP    2002-205293 A   7/2002
(Continued)

OTHER PUBLICATIONS

International Search Report dated Aug. 25, 2015. PCT/JP2015/065199, filed May 27, 2015.
(Continued)

*Primary Examiner* — Paul T Chin
(74) *Attorney, Agent, or Firm* — Oblon, McClelland, Maier & Neustadt, L.L.P.

(57) ABSTRACT

A component mounting head for mounting a component includes a head main body; a nozzle holding tool held on the head main body capable of lifting and lowering; a suction nozzle fitted into a lower end portion of the nozzle holding tool and movable in an up-down direction, and picks up and holds the component on the lower end portion of the suction nozzle, a first lifting and lowering device lifting and lowering the nozzle holding tool, a second lifting and lowering device lifting and lowering the suction nozzle, an acting force detector detecting an acting force acting on the suction nozzle in the up-down direction, and a control device controlling the second lifting and lowering device based on the acting force detected by the acting force detector, when the component is mounted, in which a bearing is interposed between the suction nozzle and the nozzle holding tool.

7 Claims, 7 Drawing Sheets

(58) Field of Classification Search
USPC .................................. 294/183, 185, 186
See application file for complete search history.

(56) References Cited

U.S. PATENT DOCUMENTS

| | | | | |
|---|---|---|---|---|
| 6,742,244 | B2* | 6/2004 | Van De Rijdt | H05K 13/0409 29/743 |
| 6,851,914 | B2* | 2/2005 | Hirata | H05K 13/0413 414/627 |
| 9,769,969 | B2* | 9/2017 | Kawaguchi | H05K 13/0408 |
| 2015/0282396 | A1 | 10/2015 | Kawaguchi | |
| 2015/0282398 | A1* | 10/2015 | Kawaguchi | H05K 13/0408 29/740 |
| 2015/0296668 | A1* | 10/2015 | Kawaguchi | H05K 13/0408 29/740 |

FOREIGN PATENT DOCUMENTS

| | | |
|---|---|---|
| JP | 2005-32860 A | 2/2005 |
| JP | 3961083 B2 | 8/2007 |
| WO | 2014/080472 A1 | 5/2014 |
| WO | WO2014/080473 * | 5/2017 |

OTHER PUBLICATIONS

Extended European Search Report dated Apr. 6, 2018 in European Patent Application No. 15893312.7 citing documents AA and AO therein, 8 pages.

* cited by examiner

COMPONENT MOUNTING HEAD AND SUCTION NOZZLE ASSEMBLY TO BE USED THEREIN

TECHNICAL FIELD

The disclosure relates to a component mounting head used when a component is mounted on a board or the like and a suction nozzle assembly to be used therein.

BACKGROUND ART

As a component mounting head, for example, a component mounting head as described in PTL 1 to be described below is being studied. The component mounting head is configured to include (a) a head main body, (b) a nozzle holding tool that is held so as to be capable of lifting and lowering to the head main body, (c) a suction nozzle that is fitted into a lower end portion of the nozzle holding tool so as to be movable in an up-down direction with respect to the nozzle holding tool and that picks up and holds a component at a lower end portion of the suction nozzle, (d) a first lifting and lowering device that lifts and lowers the nozzle holding tool with respect to the head main body, (e) a second lifting and lowering device that lifts and lowers the suction nozzle with respect to the nozzle holding tool, (f) an acting force detector that detects an acting force acting on the suction nozzle in an up-down direction, and (g) a control device that controls operation of the second lifting and lowering device based on the acting force detected by the acting force detector when component is mounted.

CITATION LIST

Patent Literature

PTL 1: Pamphlet of International Publication No. WO2014/080472A1

SUMMARY

In the component mounting head described in the PTL 1, since the operation of the second lifting and lowering device is controlled based on the acting force detected by the acting force detector, a pushing load of a component at the time of mounting the component can be set appropriately. However, even with such a component mounting head, there is a lot of room for improvement and thus practicality of such a component mounting head can be improved by performing improvements. The disclosure has been made in view of such circumstances and an object thereof is to provide a component mounting head having higher practicality. In addition, another object of the disclosure is to provide a suction nozzle assembly to be used for such a component mounting head.

In order to achieve the above objects according to the disclosure, there is provided a component mounting head in which a suction nozzle is fitted into a lower end portion of a nozzle holding tool via a bearing so as to reduce resistance to movement with respect to the nozzle holding tool in the up-down direction. In addition, according to the disclosure, there is provided a suction nozzle assembly in which an attachment which can be a portion of a nozzle holding tool and a suction nozzle are fitted into each other via a bearing.

In the component mounting head of the disclosure, since the movement of the suction nozzle with respect to the nozzle holding tool in the up-down direction is smooth by the bearing, the acting force detected by the acting force detector is made more appropriate, the suction nozzle can be further appropriately operated with respect to the nozzle holding tool when the component is mounted. As a result, the pushing load of the component can be made more appropriate when the component is mounted. By having such an advantage, practicality of the component mounting head of the disclosure can be greatly improved. In addition, the suction nozzle assembly of the disclosure which can be used for such a component mounting head contributes to improving the practicality of the component mounting head.

DESCRIPTION OF EMBODIMENTS

Hereinafter, a representative embodiment of the disclosure will be described in detail as an example with reference to the drawings. The disclosure can be practiced in various aspects in which various modifications and improvements are made based on the knowledge of those skilled in the art, in addition to the examples to be described below.

EXAMPLE

[1] Configuration of Component Mounting Head

Figure 1:
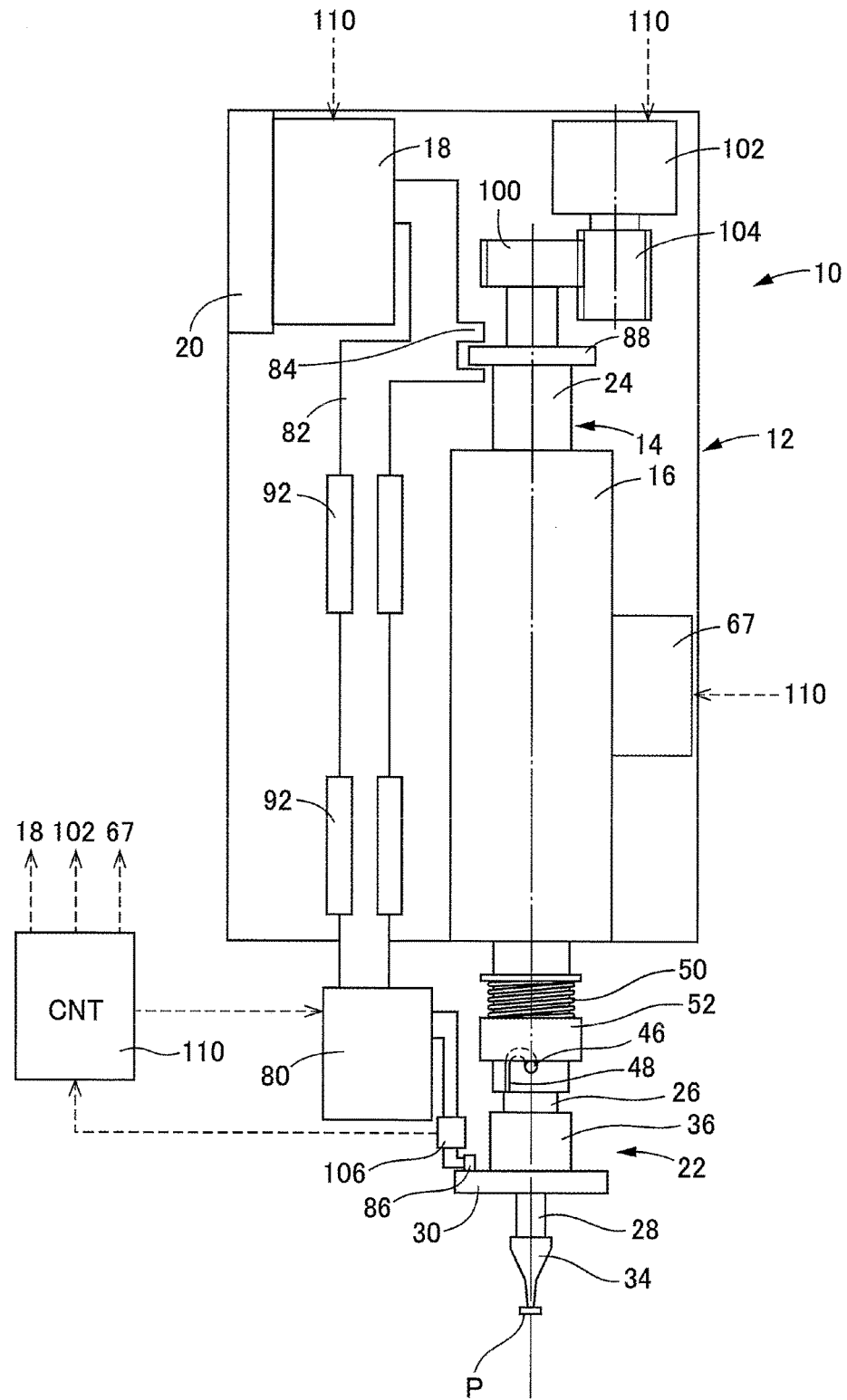
FIG. 1 is a front view illustrating a component mounting head of an example.

As illustrated in FIG. 1, a component mounting head 10 of an example (hereinafter sometimes simply referred to as "mounting head 10") includes a head main body 12 and the head main body 12 has a shaft holding section 16 that holds a rotation lifting and lowering shaft 14 in a state of allowing a movement (lifting and lowering) in a direction parallel to an axis thereof and a rotation about the axis thereof and a motor holding section 20 that fixedly holds the first linear motor 18. The shaft holding section 16 and the motor holding section 20 are fixed to each other in the mounting head 10. The rotation lifting and lowering shaft 14 holds the suction nozzle 22 as a component holding tool at a lower end portion thereof and functions as a nozzle holding tool.

Figure 2:
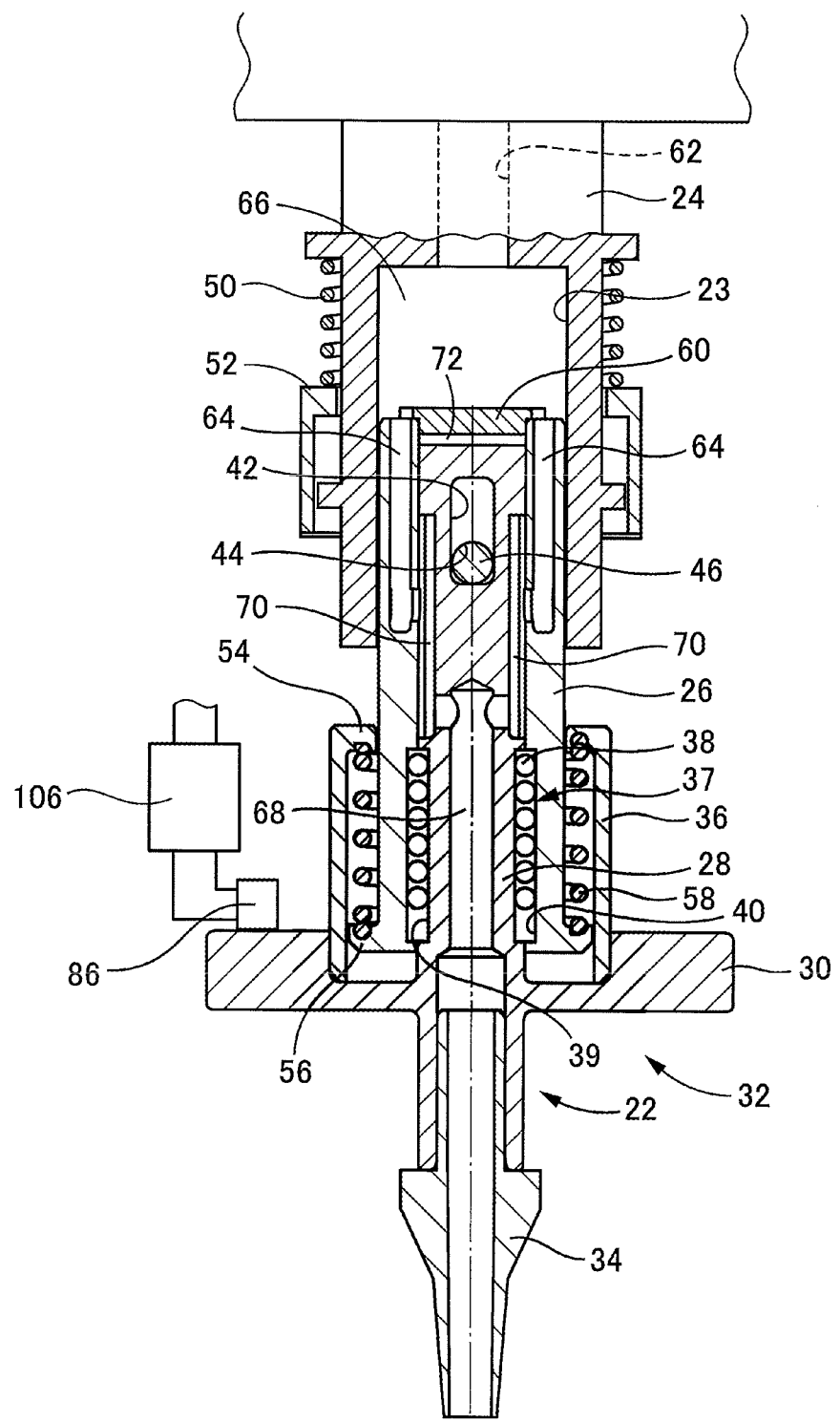
FIG. 2 is a partially sectional front view illustrating suction nozzle periphery of the component mounting head.
Figure 3:
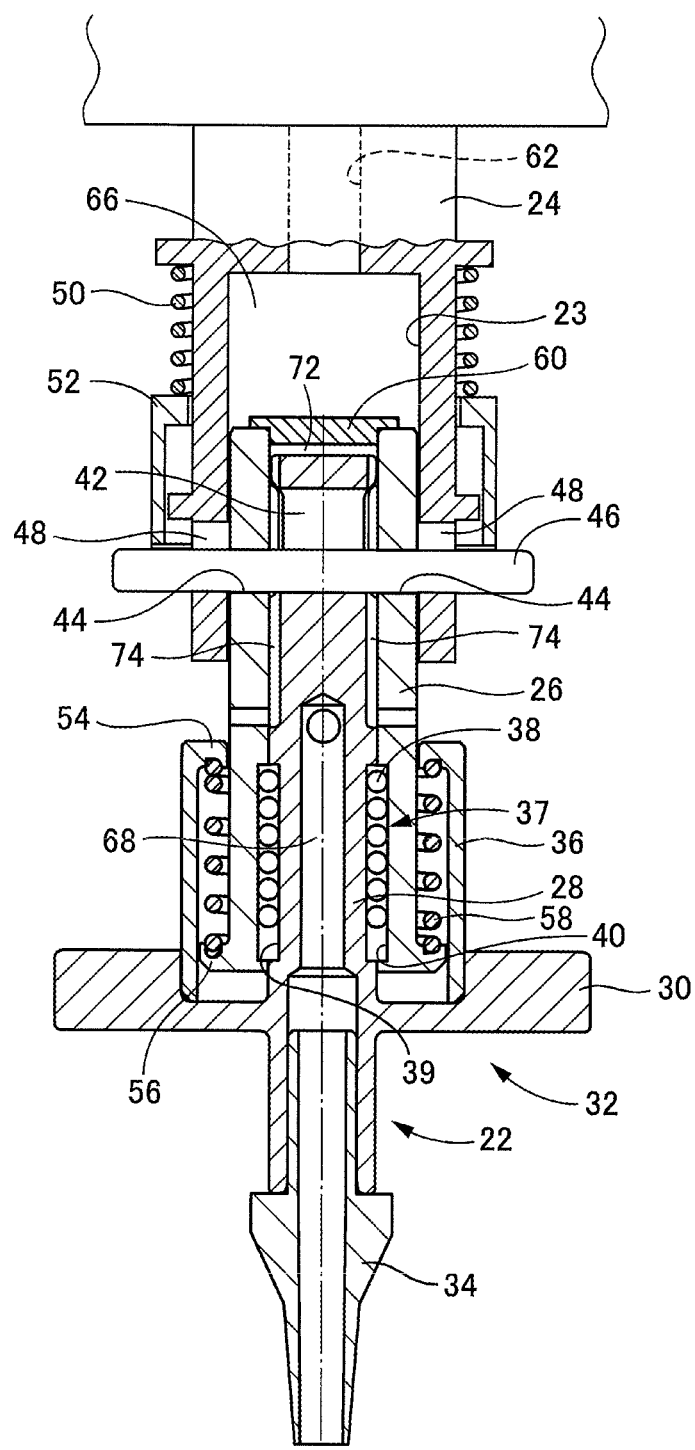
FIG. 3 is a partially sectional side view illustrating the suction nozzle periphery of the component mounting head.

As illustrated in FIG. 2 and FIG. 3 in an enlarged manner, the rotation lifting and lowering shaft 14 has a shaft main body 24 in which a mounting hole 23 is provided at the lower end portion thereof and a tubular sleeve 26 that can attach thereto and detach therefrom. The sleeve 26 is attached to and detached from the mounting hole 23 in a state where the suction nozzle 22 can be relatively moved in the axial line direction and is held so as to be relatively non-rotatable. In other words, the suction nozzle 22 is mounted on the shaft main body 24 via the sleeve 26 and the sleeve 26 functions as a portion of the rotation lifting and lowering shaft 14 after being mounted. In an explanation with different viewpoints, the rotation lifting and lowering shaft 14 which is a nozzle holding tool is configured to include the shaft main body 24 which is a shaft that can be lifted and lowered with respect to the head main body 12 and the sleeve 26 into which the suction nozzle 22 attached to the lower end portion of the shaft main body 24 is fitted and functions as an attachment and the suction nozzle 22 and the sleeve 26 that is the attachment can be integrally replaced with respect to the shaft main body 24. Incidentally, since the suction nozzle 22 and the sleeve 26 are integrated with each other, the suction nozzle 22 and the sleeve 26 can also be automatically replaced according to a component to be mounted during a component mounting work by the mounting head 10. Since the suction nozzle 22 and the sleeve 26 which is an attachment are fitted into each other, the suction nozzle 22 and the sleeve 26 can be referred to as a suction nozzle assembly.

Figure 4:
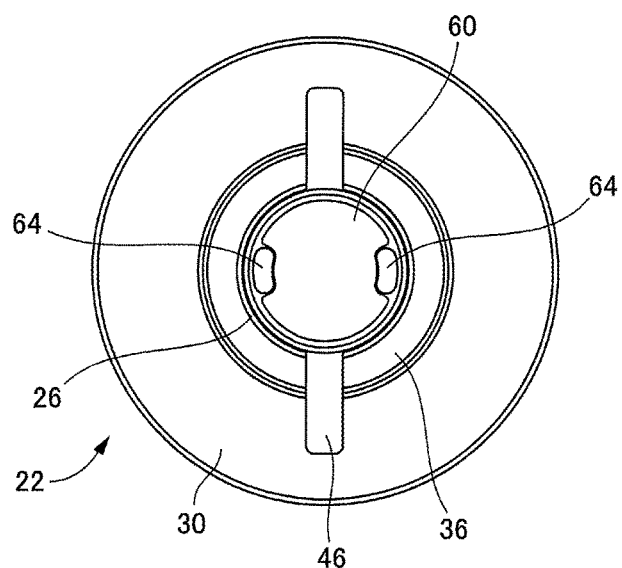
FIG. 4 is a plan view of the suction nozzle and a sleeve that holds the suction nozzle.

Furthermore, with reference to FIG. 4 as well, the suction nozzle 22 is configured to include a nozzle main body 32 that has a shaft section 28 and a flange section 30, a nozzle tip 34 that is fixed to a lower end of the shaft section 28, and a spring holding tube 36 which is fixedly attached to the flange section 30 so as to surround the shaft section 28. A portion of the shaft section 28 above the flange section 30 is fitted into the sleeve 26 via a bearing 37. Incidentally, the bearing 37 has a function of reducing resistance to the movement of the suction nozzle 22 with respect to the sleeve 26 in the up-down direction. In the suction nozzle assembly of the mounting head 10 of the present example, the suction nozzle 22 and the sleeve 26 which is an attachment are fitted into each other via the bearing 37 and thus become the suction nozzle assembly of the example.

Specifically, the bearing 37 is configured by multiple bearing balls 38 and a thin plate cylindrical retainer (not illustrated) and the multiple bearing balls 38 are arranged in multiple rows along an axial line direction, respectively. The multiple rows are positioned at equal intervals on one circumference. On the other hand, multiple grooves 39 and multiple grooves 40 that respectively extend in the axial line direction, that is, in the up-down direction, corresponding to the multiple rows are formed on an outer periphery of the shaft section 28 of the suction nozzle 22 and an inner periphery of the sleeve 26 so that the bearing ball 38 of each of the multiple rows rolls over in one of the multiple grooves 39 and one of the multiple grooves 40. By the rolling of the bearing ball 38, the resistance to the movement of the suction nozzle 22 with respect to the sleeve 26 in the up-down direction is reduced.

In addition, since the bearing balls 38 of each of the multiple rows are configured to roll over in one of the multiple grooves 39 and one of the multiple grooves 40, relative rotation between the suction nozzle 22 and the sleeve 26 is prohibited. In other words, a spline mechanism, specifically, a ball spline mechanism is configured by the bearing 37, that is, by the bearing ball 38, the groove 39, and the groove 40. Incidentally, in a place where the bearing 37 is not interposed, only a slight clearance is provided between the outer peripheral surface of the shaft section 28 of the suction nozzle 22 and the inner peripheral surface of the sleeve 26.

Relative rotation between the suction nozzle 22 and the sleeve 26 can be prohibited by providing only multiple grooves 40 without providing multiple grooves 39 in a case where the retainer is fixed to the suction nozzle 22 and by providing only multiple grooves 39 without providing multiple grooves 40 in a case where the retainer is fixed to the sleeve 26. In addition, as will be described below, a mechanism for prohibiting the relative rotation between the suction nozzle 22 and the sleeve 26 may be provided at a different place regardless of the bearing 37 constituting the spline mechanism.

A long hole 42 which is long in the up-down direction that passes through in a lateral direction is provided on the upper portion of the shaft section 28. On the other hand, the sleeve 26 is provided with a pair of holes 44 at a position facing the long hole 42. Locking pins 46 are fixed to the sleeve 26 so as to be inserted into the pair of holes 44 and the long hole 42. Portions of both ends of the locking pin 46 extending from the sleeve 26 are adapted to engage with a pair of J slots 48 provided at the lower end portion of the shaft main body 24 of the rotation lifting and lowering shaft 14 (see FIG. 1) and the suction nozzle 22, along with the sleeve 26, can be attached to and detached from the shaft main body 24 via the pair of J slots 48. The sleeve 26 is fixed to the shaft main body 24 in a state where the locking pin 46 is engaged with the pair of J slots 48 by a lock mechanism configured to include the spring 50 and the locking ring 52. Due to such fixation, the sleeve 26 cannot be moved with respect to the shaft main body 24 in the up-down direction and rotation thereof is prohibited. Although an outer diameter of the locking pin 46 is made small to some extent with respect to a width of the long hole 42, by making the outer diameter of the locking pin 46 slightly smaller, the outer diameter of the locking pin 46 may be configured so that rotation of the suction nozzle 22 with respect to the sleeve 26 is prohibited not by the spline mechanism configured to include the bearing 37 described above but by the locking pins 46 and the long hole 42.

On the other hand, the suction nozzle 22 can be moved with respect to the sleeve 26, that is, with respect to the rotation lifting and lowering shaft 14 in the up-down direction, by the long hole 42 provided on the shaft section 28 by a size corresponding to the length of the long hole 42. An inner flange 54 is provided at an upper end of the spring holding tube 36 of the suction nozzle 22 and an outer flange 56 is provided at a lower end of the sleeve 26 and a biasing spring 58 which is a compression coil spring is disposed between the sleeve 26 and the spring holding tube 36 in a state where both ends of the biasing spring 58 is supported by the inner flange 54 and the outer flange 56. The biasing spring 58 functions as an elastic body for biasing the suction nozzle 22 upward with respect to the rotation lifting and lowering shaft 14 and in a state illustrated in FIG. 2 and FIG. 3, the suction nozzle 22 is positioned at a lifting end in the movable range restricted by the long hole 42 and the locking pin 46 by the biasing spring 58. A lid 60 is attached to the upper end of the sleeve 26.

An air passage for supplying and exhausting air is provided on the rotation lifting and lowering shaft 14. Specifically, the shaft main body 24 is provided with a main passage 62 that extends through the mounting hole 23 inside the main body 24, and a pair of branch passages 64 is provided on a wall surface of the sleeve 26 so as to be positioned on sides opposite to each other in the circumferential direction. Each of the pairs of branch passages 64 has an upper end opened in the mounting hole 23 and a lower end opened in the inner peripheral surface of the sleeve 26 at an intermediate position of the shaft section 28 in the up-down direction. A first air passage which is an air passage of a rotation lifting and lowering shaft 14 side, that is, a nozzle holding tool side is configured to include the main passage 62, an air chamber 66 defined by the mounting hole 23 and the upper end of the sleeve 26, and the pair of branch passages 64. The main passage 62 is connected to an air control valve 67 on the upper side thereof and the air control valve 67 is connected to a positive and negative pressure supply source (not illustrated).

On the other hand, a nozzle side passage 68 is formed on the suction nozzle 22 so as to straddle the shaft section 28 and the nozzle tip 34. The nozzle side passage 68 functions as a second air passage, is opened at the distal end of the suction nozzle 22 and is opened in the outer peripheral surface of the shaft section 28 at two places of the intermediate portion of the shaft section 28 opposite to each other in the circumferential direction. In other words, the nozzle side passage 68 is in a closed state at the upper end portion of the suction nozzle 22. A pair of openings of the nozzle side passage 68 in the shaft section 28 is positioned at positions facing a pair of openings of the pair of branch passages 64 to the inner peripheral surface of the sleeve 26 in the circumferential direction. Incidentally, on the outer peripheral surface of the shaft section 28, a pair of grooves 70 extending in the up-down direction is provided at each position of the two openings and the pair of grooves 70 is formed at positions facing the two openings of the pair of branch passages 64 to the inner peripheral surface of the sleeve 26 in the circumferential direction. A pair of openings of the nozzle side passage 68 is opened in the pair of grooves 70. Since the opening of the two branch passages 64 and the two openings of the nozzle side passage 68 are made to communicate with each other via the two grooves 70, communication between the nozzle side passage 68 and the air passage of the nozzle holding tool side is secured even in a case where the suction nozzle 22 is positioned in any position in the movable range with respect to the sleeve 26 in the up-down direction. With the configuration, the nozzle side passage 68 and the air passage of the nozzle holding tool side communicate with each other on the surfaces facing the shaft section 28 and the sleeve 26 in the radial direction.

By negative pressure being supplied to the nozzle side passage 68, that is, since the nozzle side passage 68 is brought to a pressure lower than the atmospheric pressure, as illustrated in FIG. 1, the component P is sucked by the distal end of the suction nozzle 22 and the component P is held by the mounting head 10 at the distal end of the suction nozzle 22.

In the configuration, the negative pressure is supplied from the sleeve 26 to the suction nozzle 22 at a specific place between the inner peripheral surface of the sleeve 26 and the outer peripheral surface of the shaft section 28 of the suction nozzle 22 and the place is different from the place where the bearing 37 is disposed in the up-down direction. Therefore, according to such a configuration, for example, even in a case where the suction nozzle 22 sucks in foreign matter due to the supply of negative pressure, the incursion of the foreign matter into the place where the bearing 37 is effectively prevented. In the mounting head 10, although the specific place to which the negative pressure is supplied is above the bearing, conversely, a configuration in which the place to which negative pressure is supplied is provided below the bearing can be adopted.

In addition, another air chamber 72 is defined between the upper end of the shaft section 28 of the suction nozzle 22 and the lid 60 attached to the upper end of the sleeve 26. The volume of the air chamber 72 changed with the movement of the suction nozzle 22 with respect to the sleeve 26 in the vertical direction. Another pair of grooves 74 is formed at a position deviated by 90° with respect to the pair of grooves 70 in the circumferential direction on the outer peripheral surface of the shaft section 28 so as to prevent the pressure of the air chamber 72 from being changed due to the volume change and the air chamber 72 is opened to the atmospheric pressure via the pair of grooves 74. In other words, the air chamber 72 communicates with an outside portion of the suction nozzle 22 via a pair of grooves 74 and a pair of holes provided in the sleeve 26.

The first linear motor 18 lifts and lowers both rotation lifting and lowering shaft 14 which is a nozzle holding tool and the second linear motor 80. To this end, a lifting and lowering driving member 82 is attached to the first linear motor 18. The lifting and lowering driving member 82 extends an outside of the shaft holding section 16 of the head main body 12 along the rotation lifting and lowering shaft 14 in the up-down direction, has a first engaging section 84 at the intermediate portion, and holds the second linear motor 80 on the lower end portion. The second linear motor 80 has a second engaging section 86 configured by a roller which can rotate about a horizontal axis line. The first engaging section 84 is engaged to the flange 88 provided in vicinity of the upper end of the rotation lifting and lowering shaft 14 and the second engaging section 86 is engaged to the flange 30 of the suction nozzle 22, in a state where the rotations of the rotation lifting and lowering shaft 14 and the suction nozzle 22 are allowed respectively. A pair of guides 92 is attached to the head main body 12, and the movement of the lifting and lowering driving member 82 in the vertical direction is guided by the pair of guides 92.

A gear 100 is provided above the flange 88 of the rotation lifting and lowering shaft 14 and is engaged with a gear 104 fixed to a rotation shaft of a rotation motor 102 which is a rotary driving source attached to the head main body 12. The gears 100 and 104 transmit the rotation of the rotation motor 102 to the rotation lifting and lowering shaft 14 while allowing lifting and lowering of the rotation lifting and lowering shaft 14. The rotation motor 102, the gears 100, and 104 constitute a rotation driving device of the rotation lifting and lowering shaft 14 and the rotation of the rotation lifting and lowering shaft 14 is transmitted to the sleeve 26 and the suction nozzle 22 respectively by engagement of the J slot 48 and the locking pin 46 and by a bearing 37 functioning as the spline mechanism described above.

With the configuration, in the mounting head 10, the first lifting and lowering device which includes the first linear motor 18 and the lifting and lowering driving member 82 and thus lifts and lowers the rotation lifting and lowering shaft 14 which is a nozzle holding tool with respect to the head main body 12 is configured and, in addition, the second lifting and lowering device which includes the second linear motor 80 and the biasing spring 58 described above and thus lifts and lowers the suction nozzle 22 with respect to the head main body 12 is configured. The second lifting and lowering device can also be considered as a device that lifts and lowers the suction nozzle 22 with respect to the rotation lifting and lowering shaft 14. Incidentally, the biasing spring 58 in the second lifting and lowering device of the mounting head 10 biases the suction nozzle 22 in a direction in which the suction nozzle 22 is lifted and the second linear motor 80 lowers the suction nozzle 22 acting a force in a direction in which the suction nozzle 22 is lowered against the force acting on the suction nozzle 22 by the biasing spring 58. The second lifting and lowering device may be configured by the biasing spring for biasing the suction nozzle 22 in a direction in which the suction nozzle 22 is lowered and a motor for biasing the suction nozzle 22 in a direction in which the suction nozzle 22 is lifted.

In the mounting head 10, in order to detect a force received from the suction nozzle 22 by the second linear motor 80, the load cell 106 is provided between the main body section of the second linear motor 80 and the second engaging section 86 described above. The load cell 106 functions as an acting force detector for detecting the force acting on the suction nozzle 22 in the up-down direction. Specifically, in the mounting head 10, there is an upward force acting on the suction nozzle 22 and the force can be considered as a reacting force of a downward force exerted by the second linear motor 80. In other words, generally, sum of the upward force that is acted on the suction nozzle 22 by the biasing spring 58 based on the elastic reacting force and the upward force that is acted on the suction nozzle 22 by the board via the component when the component is mounted on the board is detected by the load cell 106 as an acting force.

The mounting head 10 is moved to above a component supply device along the XY-plane and above a board holding device holding the board as the circuit substrate by the XY-moving device (not illustrated). When the mounting head 10 is positioned above the component supply device, the suction nozzle 22 is lifted and lowered in the Z-direction perpendicular to the XY-plane and picks up the component from the component supply device. In short, when being positioned above the board holding device, the suction nozzle 22 is lifted and lowered in the Z-direction perpendicular to the XY-plane and the component held by the suction nozzle 22 is mounted. Simply put, at the time of the mounting, the first linear motor 18 lowers the lifting and lowering driving member 82 to lower the rotation lifting and lowering shaft 14 and the second linear motor 80 and, at the same time, the second linear motor 80 operates the suction nozzle 22 with respect to the rotation lifting and lowering shaft 14 in the up-down direction. The operation of the mounting head 10 upon the mounting will be described in detail below. When the suction nozzle 22 is lifted and lowered, the mounting head 10 itself may also be lifted and lowered. In addition, the rotation motor 102 is operated as necessary, and a rotational posture of the component held by the suction nozzle 22 is corrected or changed. Since the control of the first linear motor 18, the air control valve 67, the rotation motor 102 and the like in the operation described above is the same as that of the ordinary mounting head, explanation thereof will be omitted.

The control of the operation of the mounting head 10 is performed by the control device 110 illustrated in FIG. 1. Therefore, the first linear motor 18, the second linear motor 80, the rotation motor 102, and the air control valve 67 are connected to the control device 110. Although will be described in detail below, since the control of the second linear motor 80 when the component is mounted is performed based on the acting force detected by the load cell 106, the load cell 106 is also connected to the control device 110.

[2] Control of Component Mounting Head when Component is Mounted

When mounting (placing) the component held by the suction nozzle 22 on the board, there is a possibility that the component is subjected to an impact due to the component contacting the board. In addition, in consideration of mounting components to the board on which the cream solder is printed, it is desirable to push the component against the board with a set force after the component makes contact. In order to alleviate the impact received by the components and to push the components against the board with a proper force, in the mounting head 10, the operation of the second linear motor 80 is controlled based on the acting force detected by the load cell 106.

Figure 5:
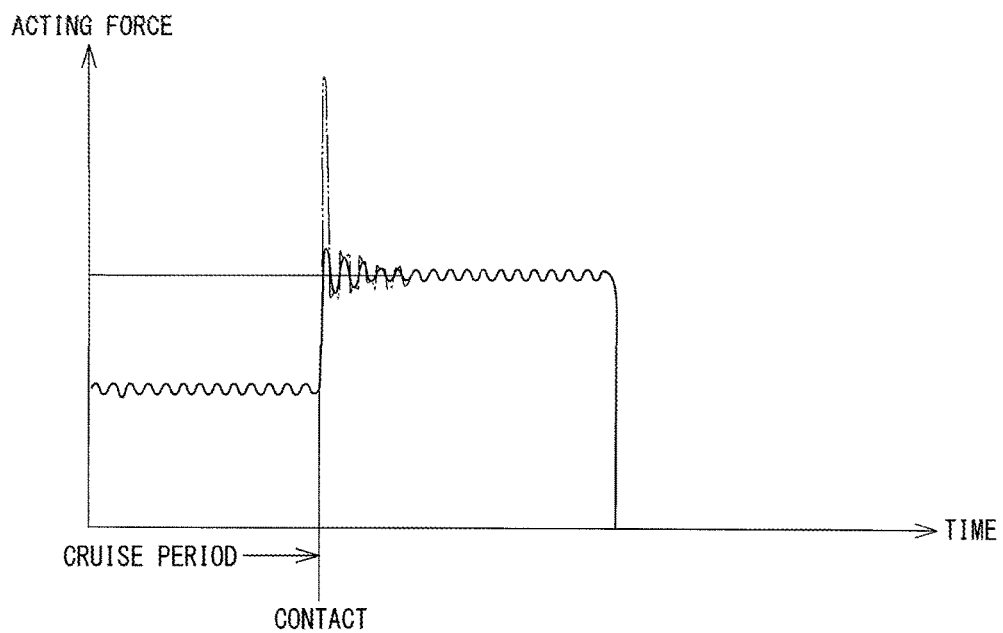
FIG. 5 is a graph illustrating a temporal change of an acting force of the suction nozzle when a component is mounted.

FIG. 5 illustrates a temporal change in the acting force detected by the load cell 106 when the component is mounted. When the component is mounted, although the suction nozzle 22 is lowered by the first linear motor 18, if the period until the component comes into contact with the board is referred to as a cruise period, current is supplied to the second linear motor 80 so that the suction nozzle 22 is in a state of being lowered by a predetermined amount with respect to the sleeve 26 while the biasing spring 58 is compressed in the cruising period. Specifically, the current supplied to the second linear motor 80 is feedback-controlled based on the detected acting force so that the acting force detected by the load cell 106 becomes the set target acting force.

The contact against the component to the board is detected based on the change in the acting force detected by the load cell 106 and at this time, the target acting force is changed to a value so that the component is pushed against the board with the set force (set pushing force). At the time of the contact, although a large force is applied to the component, in order to reduce the force applied to the component, the current supplied to the second linear motor 80 is reduced by the feedback control. In other words, feedback control is performed such that the force set for the component is applied when the component is mounted. As a result, the force exerted by the second linear motor 80 is reduced and a cushion-like effect is obtained.

If the responsiveness of the feedback control is poor, the force applied to the components at the time of the contact increases as indicated by the two-dot chain line in FIG. 5. The mounting head 10 is a high-frequency control system that can execute at least two cycles of control cycles until the force applied to the components at the time of the contact exceeds the allowable contact force and becomes excessive and as soon as the abutment is detected, the control device 110 controls the current supplied to the second linear motor 80 so that the reacting force becomes equal to the set pushing force. As a result, the change of the reacting force is suppressed to be small as indicated by the solid line and the abutment impact at the time of the abutment described above is suppressed to a size that does not damage the component P. In other words, in the mounting head 10, feedback control with considerable responsiveness is performed.

After the set time elapses after the component is brought into contact with the board, the negative pressure that is supplied to the nozzle side passage 68 of the suction nozzle 22 via the air passage on the nozzle holding tool side is released and the suction of the component to the suction nozzle 22 is released. Although release of the negative pressure may be performed by opening the nozzle side passage 68 to atmospheric pressure, in the mounting head 10, in order to more effectively release the suction of the components, the release of the negative pressure is performed by supplying a positive pressure to the nozzle side passage 68 through the air passage of the nozzle holding tool side. After the set time is elapsed after the supply of the positive pressure, the suction nozzle 22 is lifted by the first linear motor 18 and thus the component remains in a state of being placed on the board, and thus the mounting of components on the board is completed.

In the mounting head 10, the acting force is detected using the load cell 106. In other words, the load cell 106 constitutes an acting force detector. The force acted in a direction to lower the suction nozzle 22 by the second linear motor 80, that is, the force generated by the second linear motor 80 can be considered as the acting force acting on the suction nozzle 22 from the biasing spring 58 and a reacting force of the acting force acting on the suction nozzle 22 from the board via the component and generally corresponds to the current actually supplied to the second linear motor 80. Therefore, by monitoring the actual supply current to the second linear motor 80, the force generated by the second linear motor 80, that is, the acting force on the suction nozzle 22 can be monitored. Using the fact described above, the control described above also can be performed by the feedback control based on the actual supply current being performed so that the second linear motor 80 generates the target acting force which is the target of the force acting on the suction nozzle 22 by the second linear motor 80. In a case of performing such control, the current detector that detects the actually supplied current functions as an acting force detector instead of the load cell 106. In other words, the second linear motor 80 may perform the feedback control without using the load cell 106.

Although the feedback control is performed to generate the target acting force, the second linear motor 80 is equipped with an encoder for detecting the operating position of the second linear motor 80 and actually, the target acting force and the target action position based on the acting force detected by the load cell 106 is calculated, and the feedback control is performed based on the target operation position.

[3] Resistance to Movement of Suction Nozzle with Respect to Sleeve in Up-Down Direction In the mounting head 10 of the example, although the suction nozzle 22 is fitted into the sleeve 26 via the bearing 37, in the mounting head of the related art, for example, in the mounting head described in the PTL 1 described above, the shaft section of the suction nozzle is fitted into the sleeve without passing through the bearing. Because of such a configuration, when the suction nozzle moves with respect to the sleeve in the up-down direction, although the resistance to the movement is relative, the resistance is large.

In a case where the acting force is detected by the acting force detector and feedback control is performed so that the force set on the component is applied when the component is mounted based on the detected acting force, it is important for the control that the acting force is accurately detected. However, in a head having a structure in which the shaft section of a suction nozzle is fitted into a sleeve without a bearing interposed therebetween, like the mounting head of the related art, there is a possibility that the acting force cannot be accurately detected by the resistance. Specifically, when the component contacts the board, although a relatively large force acts on the suction nozzle via the component, in a case where the resistance is large, the acting force detected by the acting force detector becomes a small value by the resistance. Based on such acting force, there is a risk that appropriate control, that is, relief of the impact received by the components and pushing of the component against the board with proper force cannot be performed appropriately.

In addition, in a case where the shaft section of the suction nozzle is fitted into the sleeve without interposing a bearing, although the outer peripheral surface of the shaft section of the suction nozzle and the inner peripheral surface of the sleeve become slide contact surfaces with each other, there is a possibility of fine foreign matter intruding between the slide contact surfaces, and in a case where foreign matter enters, the resistance becomes further larger. Furthermore, in a case where the outer peripheral surface of the shaft section of the suction nozzle and the inner peripheral surface of the sleeve becomes the slide contact surfaces, there is a possibility that change in resistance due to change in the surface roughness of the outer peripheral surface and the inner peripheral surface and change in resistance due to change in relative position between the suction nozzle and the sleeve is large and there is a concern that appropriate adjustment of acting force detector, the control device, or the like is inhibited.

In order to solve the problem described above, in the mounting head 10 of the example, by adopting the bearing 37, specifically bearing having a structure in which the bearing ball 38 is rolled along with relative movement of the suction nozzle 22 and the sleeve 26 in the up-down direction, the resistance to the movement with respect to the sleeve 26 of the suction nozzle 22 in the up-down direction is relative small and in addition the stable and smooth movement of the suction nozzle 22 in the up-down direction is guaranteed. As a result, according to the mounting head 10 of the example, it is possible to accurately detect the acting force and it is possible to alleviate the impact received by the component when the component is mounted on the board and to push the component against the board with an appropriate force.

In the mounting head 10 of the example, a bearing 37 is provided between the sleeve 26 which is an attachment and the suction nozzle 22. For example, it is also possible to provide a bearing between the shaft main body 24 and the sleeve 26 so as to move the sleeve 26 and the suction nozzle 22 integrally relative to the shaft main body 24. However, according to such a configuration, the weight of the portion to be operated by the second linear motor 80 is increased. By adopting a configuration in which the bearing 37 is provided between the sleeve 26 which is an attachment and the suction nozzle 22 and furthermore the bearing 37 being held on the sleeve 26 side, the weight of the portion operated by the second linear motor 80 can be made considerably small and control with good responsiveness can be performed.

[4] Alternative Embodiment

Figure 6:
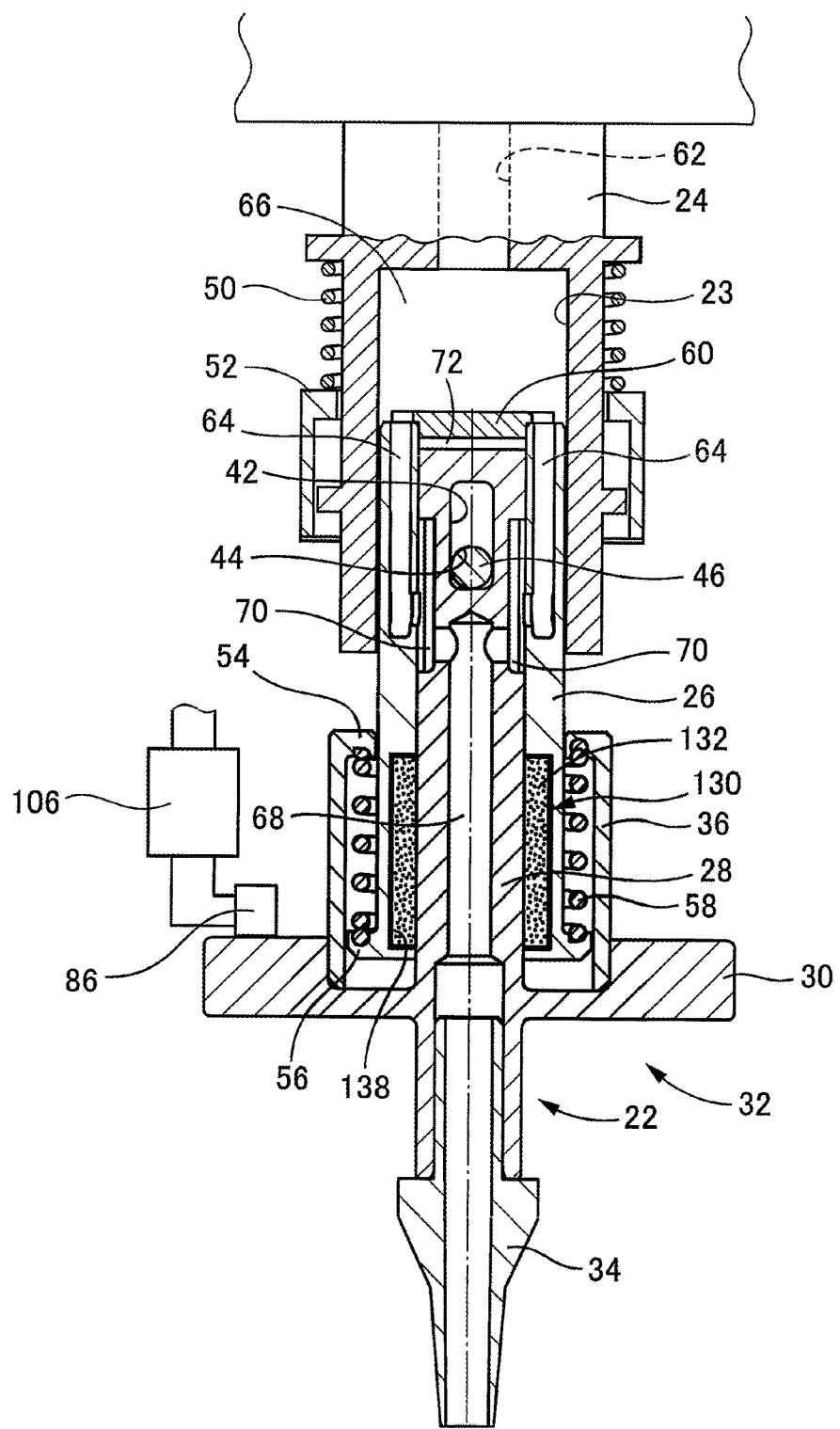
FIG. 6 is a partially sectional front view illustrating suction nozzle periphery of a component mounting head of an alternative embodiment.
Figure 7:
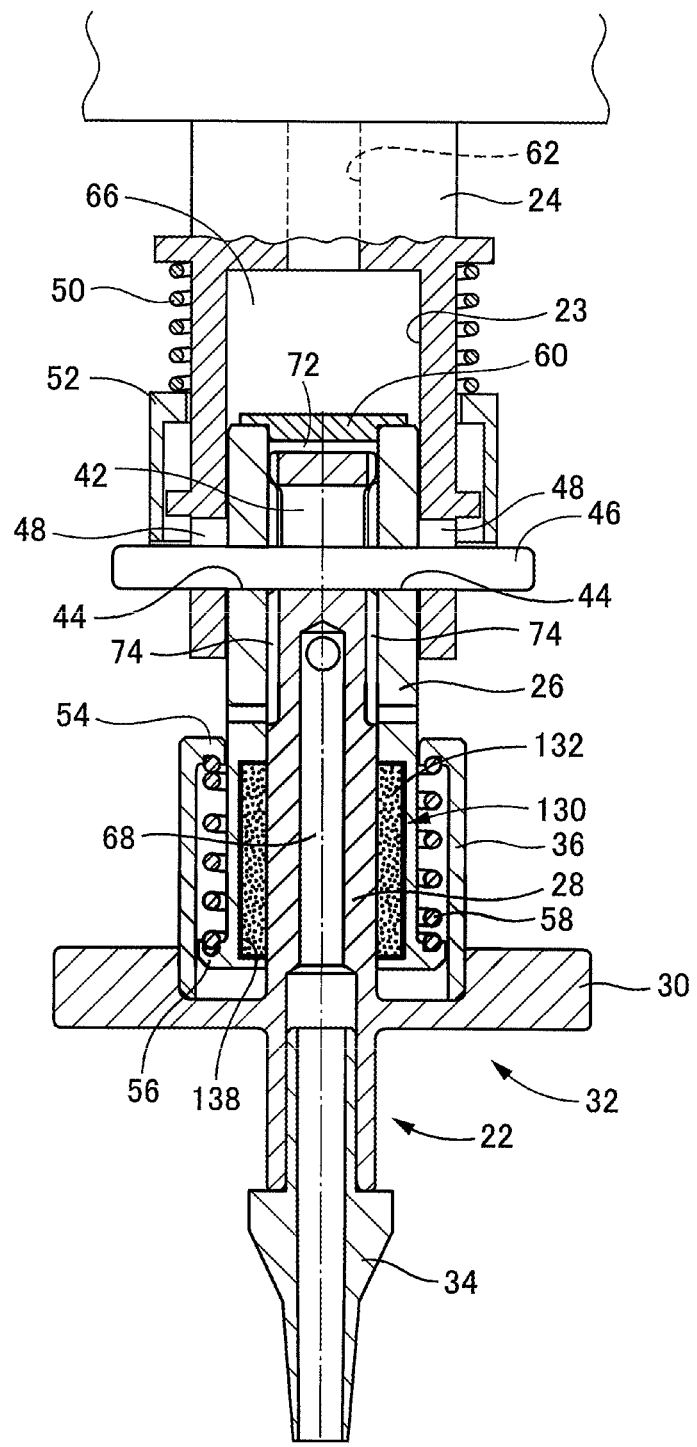
FIG. 7 is a partially sectional side view illustrating the suction nozzle periphery of the component mounting head of the alternative embodiment.
Figure 8:
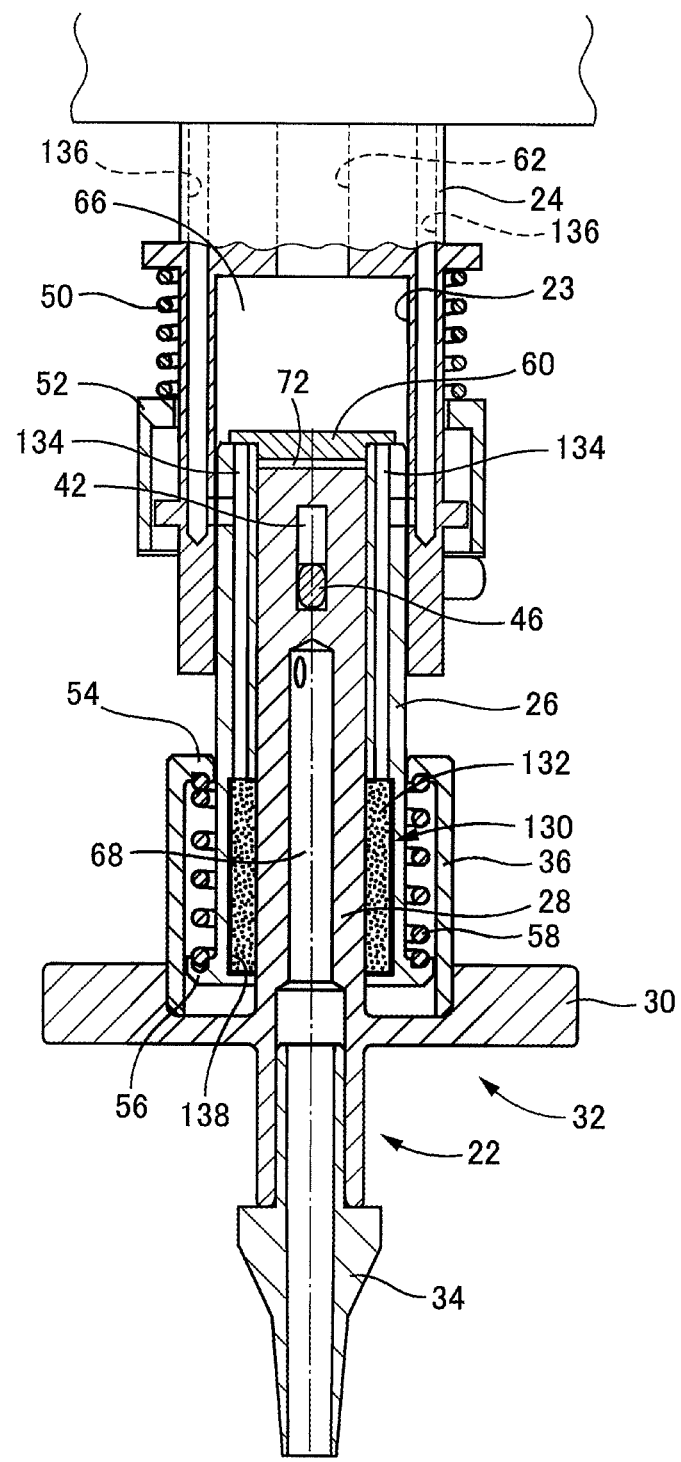
FIG. 8 is a partially sectional view illustrating the suction nozzle periphery of the component mounting head of the alternative embodiment and is a partially sectional view illustrating from a different angle from the partially sectional front view and the partially sectional side view.

In the mounting head 10 of the example, although the suction nozzle 22 is fitted into the sleeve 26 via the bearing 37 using the rolling of the bearing ball 38, in the mounting head 10 (to be indicated by the same reference numeral) of the alternative embodiment, in place of the bearing 37, a bearing that interposes an air layer between the sliding surfaces, so-called air bearing is adopted. Hereinafter, although the structure of the mounting head 10 according to the alternative embodiment will be described below with reference to FIGS. 6 to 8, since only the configuration related to the bearing is different from each other, the same reference numerals as those of the mounting head 10 of the example are adopted for constituent elements having the same function and description thereof will be omitted. The cross sections illustrated in FIG. 6 and FIG. 7 are surfaces at the same positions as those in FIG. 2 and FIG. 3 with respect to the mounting head 10 of the example, respectively, and the cross section illustrated in FIG. 8 is a cross section intermediate between the cross section illustrated in FIG. 6 and the cross section illustrated in FIG. 7, that is, is a vertical cross section forming an angle of 45° with respect to those cross sections.

The bearing 130 adopted in the mounting head 10 of the alternative embodiment is configured to include a tubular porous material body 132 and the porous material body 132 is held in the sleeve 26 at a portion where the inner diameter of the sleeve 26 is enlarged. The porous material body 132 has a structure in which air flows through innumerable pores therein. The shaft sections 28 of the suction nozzle 22 are fitted into the sleeve 26 so as to interpose the porous material body 132 therebetween. As can be seen from FIG. 8, the sleeve 26 is provided with a pair of air passages 134 which is positioned on opposite sides to each other in the circumferential direction and extend in the up-down direction and on the other hand, also on the shaft main body 24, a pair of air passages 136 extending in the up-down direction is provided at the same positions as the pair of air passages 134 in the circumferential direction. Each air passage 134 communicates with the corresponding air passage 136, in the inner peripheral surface of the mounting hole 23 of the shaft main body 24 and the outer peripheral surface of the sleeve 26. Each of the air passages 134 is opened such that the upper end thereof is closed by the lid 60 and the lower end thereof faces the upper end face of the porous material body 132. A resinous coating film 138 is formed on the outer peripheral surface, the upper end face, and the lower end face of the porous material body 132, except for portions facing the opening and the flow of the air on the surface where the coating film 138 is formed is blocked.

With the structure as described above, compressed air is supplied to the air passage 136 from the head main body 12 side and thus the compressed air is introduced into the porous material body 132 via the air passage 134. The introduced compressed air flows out from the entire surface of the inner peripheral surface of the porous material body 132 and the outflowing air forms an air layer between the outer peripheral surface of the shaft section 28 of the suction nozzle 22 and the inner peripheral surface of the porous material body 132. Due to the existence of the air layer, the suction nozzle 22 smoothly moves with respect to the sleeve 26 in the up-down direction without the suction nozzle 22 and the sleeve 26 being in slide contact with each other. Air in the air layer is discharged upward along the outer peripheral surface of the sleeve 26 from the lower end of the sleeve 26 and the air is prevented from influencing the negative pressure supplied to the nozzle side passage 68.

According to the action of the bearing 130, the bearing 130 is disposed on the mutually facing surfaces of the suction nozzle 22 and the sleeve 26 which is a nozzle holding tool and is regarded as an air bearing having a function of interposing air layer between the facing surface of the suction nozzle 22 and the bearing. It is also possible to adopt an air bearing having a structure in which a porous material body is held on the outer peripheral portion of the suction nozzle 22 and an air layer is interposed between the facing surface of the sleeve 26 and the bearing.

By adopting the bearing 130 as well, as with the mounting head 10 of the example, it is possible to make resistance to movement of the suction nozzle 22 with respect to the sleeve 26 in the up-down direction relatively small and in addition, the stable and smooth movement of the suction nozzle 22 in the up-down direction can be guaranteed. As a result, by the mounting head 10 according to the alternative embodiment as well, it is possible to accurately detect the acting force described above, to alleviate the impact received by the component when the component is mounted on the board, and to push the component against the board with appropriate force.

Incidentally, in the mounting head 10 of the alternative embodiment, the suction nozzle assembly adopted, that is, the assembly in which the suction nozzle 22 and the sleeve 26 which is the attachment are fitted into each other via the bearing 130 becomes a suction nozzle assembly of the alternative embodiment. Although the suction nozzle assembly of the above example and the suction nozzle assembly of the alternative embodiment are suitable for the mounting head 10 of the example and the mounting head 10 of the alternative embodiment, these suction nozzle assemblies can be used not only in such a mounting head 10 but also in a general component mounting head.

REFERENCE SIGNS LIST

10: component mounting head, 12: head main body, 14: rotation lifting and lowering shaft (nozzle holding tool), 18: first linear motor (first lifting and lowering device), 22: suction nozzle, 24: shaft main body (shaft), 26: sleeve (attachment), 37: bearing, 38: bearing ball, 39: groove (on suction nozzle side), 40: groove (on sleeve side), 58: biasing spring (second lifting and lowering device), 80: secondary linear motor (second lifting and lowering device), 82: lifting and lowering driving member (first lifting and lowering device), 106: load cell (acting force detector), 110: control device, 130: bearing, 132: porous material body, 134: air passage, 136: air passage

The invention claimed is:

1. A component mounting head for mounting a component, comprising:
   a head main body;
   a nozzle holding tool that is held on the head main body so as to be capable of lifting and lowering;
   a suction nozzle that is fitted into a lower end portion of the nozzle holding tool to be movable with respect to the nozzle holding tool in an up-down direction and picks up and holds the component on the lower end portion of the suction nozzle;
   a first lifting and lowering device that lifts and lowers the nozzle holding tool with respect to the head main body;
   a second lifting and lowering device that lifts and lowers the suction nozzle with respect to the nozzle holding tool;
   an acting force detector that detects an acting force acting on the suction nozzle in the up-down direction; and
   a control device that controls an operation of the second lifting and lowering device based on the acting force detected by the acting force detector, when the component is mounted,
   wherein the suction nozzle is fitted into the lower end portion of the nozzle holding tool via a bearing for reducing resistance to movement with respect to the nozzle holding tool in the up-down direction,
   wherein the bearing reduces the resistance by rolling of a bearing ball, and
   wherein the bearing is configured so that the bearing ball rolls in a groove which is provided on at least one of the suction nozzle and the nozzle holding tool and extends in the up-down direction.

2. A component mounting head for mounting a component, comprising:
a head main body;
a nozzle holding tool that is held on the head main body so as to be capable of lifting and lowering;
a suction nozzle that is fitted into a lower end portion of the nozzle holding tool to be movable with respect to the nozzle holding tool in an up-down direction and picks up and holds the component on the lower end portion of the suction nozzle;
a first lifting and lowering device that lifts and lowers the nozzle holding tool with respect to the head main body;
a second lifting and lowering device that lifts and lowers the suction nozzle with respect to the nozzle holding tool;
an acting force detector that detects an acting force acting on the suction nozzle in the up-down direction; and
a control device that controls an operation of the second lifting and lowering device based on the acting force detected by the acting force detector, when the component is mounted,
wherein the suction nozzle is fitted into the lower end portion of the nozzle holding tool via a bearing for reducing resistance to movement with respect to the nozzle holding tool in the up-down direction,
wherein the lower end portion of the nozzle holding tool has a tubular shape and the suction nozzle is fitted so as to fit into the tubular lower end portion thereof, and
wherein supply of a negative pressure from the nozzle holding tool to the suction nozzle is performed at a specific place between an inner peripheral surface of the nozzle holding tool and an outer peripheral surface of the suction nozzle and the place is different from a place where the bearing is disposed in the up-down direction.

3. The component mounting head according to claim 1, wherein the nozzle holding tool is configured to include a shaft which can be lifted and lowered with respect to the head main body, and an attachment which is attached to the lower end portion of the shaft and into which the suction nozzle is fitted, and
wherein the bearing is disposed between the attachment and the suction nozzle and the attachment and the suction nozzle can be integrally replaced with respect to the shaft.

4. The component mounting head according to claim 2, wherein the bearing is an air bearing which is disposed between mutual facing surfaces of the suction nozzle and the nozzle holding tool and in which an air layer is interposed between the facing surface of one of the suction nozzle and the nozzle holding tool and the air bearing.

5. The component mounting head according to claim 2, wherein the nozzle holding tool is configured to include a shaft which can be lifted and lowered with respect to the head main body, and an attachment which is attached to the lower end portion of the shaft and into which the suction nozzle is fitted, and
wherein the bearing is disposed between the attachment and the suction nozzle and the attachment and the suction nozzle can be integrally replaced with respect to the shaft.

6. A suction nozzle assembly to be used in a component mounting head for mounting a component, comprising:
an attachment that is attached to a lower end portion of a shaft which is lifted and lowered in the component mounting head; and
a suction nozzle that is fitted into the attachment to be movable in an up-down direction in a state where the attachment is attached to the shaft and picks up and holds the component on the lower end portion of the suction nozzle,
wherein the suction nozzle is fitted into the attachment via a bearing for reducing resistance to movement with respect to the attachment in the up-down direction,
wherein the bearing reduces the resistance by rolling of a bearing ball, and
wherein the bearing is configured so that the bearing ball rolls in a groove which is provided on at least one of the suction nozzle and a nozzle holding tool and extends in the up-down direction.

7. A suction nozzle assembly to be used in a component mounting head for mounting a component, comprising:
an attachment that is attached a lower end portion of a shaft which is lifted and lowered in the component mounting head; and
a suction nozzle that is fitted into the attachment to be movable in an up-down direction in a state where the attachment is attached to the shaft and picks up and holds the component on the lower end portion of the suction nozzle,
wherein the suction nozzle is fitted into the attachment via a bearing for reducing resistance to movement with respect to the attachment in the up-down direction,
wherein the lower end portion of a nozzle holding tool has a tubular shape and the suction nozzle is fitted so as to fit into the tubular lower end portion thereof, and
wherein supply of a negative pressure from the nozzle holding tool to the suction nozzle is performed at a specific place between an inner peripheral surface of the nozzle holding tool and an outer peripheral surface of the suction nozzle and the place is different from a place where the bearing is disposed in the up-down direction.

* * * * *